United States Patent
Tsujino et al.

(10) Patent No.: US 8,653,649 B2
(45) Date of Patent: Feb. 18, 2014

(54) DEVICE HOUSING PACKAGE AND MOUNTING STRUCTURE

(75) Inventors: Mahiro Tsujino, Higashiomi (JP); Mamoru Kinoshita, Higashiomi (JP); Kiyoshige Miyawaki, Kyoto (JP)

(73) Assignee: Kyocera Corporation, Kyoto (JP)

( * ) Notice: Subject to any disclaimer, the term of this patent is extended or adjusted under 35 U.S.C. 154(b) by 120 days.

(21) Appl. No.: 13/391,807

(22) PCT Filed: Sep. 24, 2010

(86) PCT No.: PCT/JP2010/066550
§ 371 (c)(1),
(2), (4) Date: Feb. 22, 2012

(87) PCT Pub. No.: WO2011/040329
PCT Pub. Date: Apr. 7, 2011

(65) Prior Publication Data
US 2012/0147539 A1    Jun. 14, 2012

(30) Foreign Application Priority Data

Sep. 29, 2009 (JP) ................ 2009-223746
Oct. 29, 2009 (JP) ................ 2009-248904
Feb. 24, 2010 (JP) ................ 2010-038546

(51) Int. Cl.
*H05K 7/00* (2006.01)
*H01L 23/34* (2006.01)

(52) U.S. Cl.
USPC ........... 257/698; 257/678; 257/728; 257/664; 361/379.01

(58) Field of Classification Search
CPC ...................................... H05K 7/00
USPC ............. 257/678, 728, 664, 698; 361/679.01
See application file for complete search history.

(56) References Cited

U.S. PATENT DOCUMENTS

| 6,365,961 B1 * | 4/2002 | Tomie ................... 257/664 |
| 6,369,324 B1 * | 4/2002 | Tomie ................... 174/650 |
| 6,992,250 B2 * | 1/2006 | Kubota et al. ........... 174/549 |
| 2002/0140071 A1 | 10/2002 | Leighton et al. |
| 2010/0252313 A1 * | 10/2010 | Tsujino ................... 174/260 |

FOREIGN PATENT DOCUMENTS

| JP | 08-227949 | 9/1996 |
| JP | 11-176988 | 7/1999 |
| JP | 2003-100922 | 4/2003 |
| JP | 2004-349568 | 12/2004 |
| JP | 2007150043 A | 6/2007 |
| JP | 2009-010149 | 1/2009 |

OTHER PUBLICATIONS

Chinese language office action dated Dec. 17, 2013 and its English language concise explanation issued in corresponding Chinese application 201080035011.3 cites the U.S. patent application publication and foreign patent documents listed above.

* cited by examiner

*Primary Examiner* — Long K Tran
*Assistant Examiner* — Jordan Klein
(74) *Attorney, Agent, or Firm* — DLA Piper LLP (US)

(57) ABSTRACT

A device housing package includes a substrate having a device mounting region; a frame body having a through hole formed in part thereof, the frame body being disposed on the substrate so as to lie along a periphery of the device mounting region; and an input-output terminal disposed in the through hole, having a first dielectric layer; a signal line formed on the first dielectric layer; a first ground layer formed on a lower face of the first dielectric layer; a second dielectric layer formed on the signal line so as to overlap the frame body; a second ground layer formed on an upper face of the second dielectric layer; and a metal layer disposed within the second dielectric layer The metal layer is formed to extend from the second dielectric layer to the first dielectric layer, being separated from the signal line.

8 Claims, 17 Drawing Sheets

(A)

(B)

DEVICE HOUSING PACKAGE AND MOUNTING STRUCTURE

CROSS-REFERENCE TO THE RELATED APPLICATIONS

This application is a national stage of international application No. PCT/JP2010/066550, filed on Sep. 24, 2010, and claims the benefit of priority under 35 USC 119 to Japanese Patent Application No. 2009-223746, filed Sep. 29, 2009, Japanese Patent Application No. 2009-248904, filed on Oct. 29, 2009 and Japanese Patent Application No. 2010-038546, filed on Feb. 24, 2010, the entire contents of all of which are incorporated herein by reference.

TECHNICAL FIELD

The present invention relates to a device housing package and a mounting structure using the device housing package.

BACKGROUND ART

There has heretofore been known a device housing package having an input-output terminal comprising a dielectric layer with a signal line formed on one main surface thereof and a ground layer formed on the other main surface thereof (refer to Japanese Unexamined Patent Publication JP-A 8-227949 (1996), for example). Currently, there is an increasing demand for a device housing package which is, even if a signal to be transmitted through a signal line falls in a high-frequency range such as a microwave range or a millimeter-wave range, capable of affording excellent high-frequency transmission characteristics while minimizing electromagnetic-wave leakage. An object of the invention is to provide a device housing package which excels in high-frequency transmission characteristics and a mounting structure using the device housing package.

DISCLOSURE OF INVENTION

A device housing package in accordance with one embodiment of the invention includes: a substrate having a device mounting region in an upper face thereof; and a frame body having a through hole formed in part thereof, the frame body being disposed on the substrate so as to lie along a periphery of the device mounting region. The device housing package further includes an input-output terminal disposed in the through hole, the input-output terminal having a first dielectric layer extending interiorly and exteriorly of the frame body; a signal line formed on the first dielectric layer and configured to provide electrical connection between an interior of the frame body and an exterior thereof; a first ground layer formed on a lower face of the first dielectric layer; a second dielectric layer formed on the signal line so as to overlap the frame body as viewed in a transparent plan view; a second ground layer formed on an upper face of the second dielectric layer; and a pair of metal layers disposed within the second dielectric layer so as to extend from the interior of the frame body to the exterior thereof along the signal line. The pair of metal layers are formed to extend from the second dielectric layer to the first dielectric layer, connecting with the first ground layer and the second ground layer, being separated from the signal line.

Moreover, a mounting structure in accordance with the second embodiment of the invention includes: the device housing package as mentioned above; and a device mounted in the device housing package.

DESCRIPTION OF EMBODIMENTS

Hereinafter, an embodiment of a device housing package pursuant to the invention will be described in detail with reference to the accompanying drawings. It should be noted that the application of the invention is not limited to the embodiment as set forth hereunder.

<General Structure of Device Housing Package>

Figure 1:
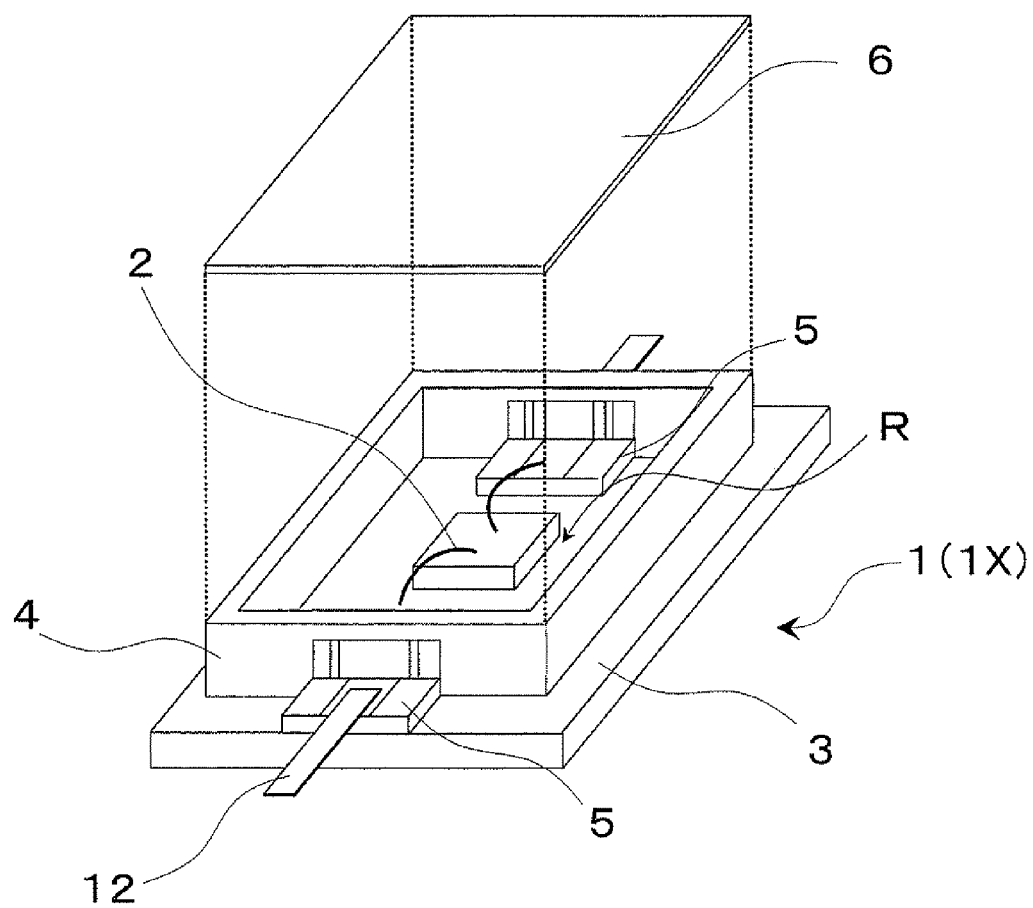
FIG. 1 is a perspective view showing an overview of a device housing package in accordance with an embodiment.
Figure 2:
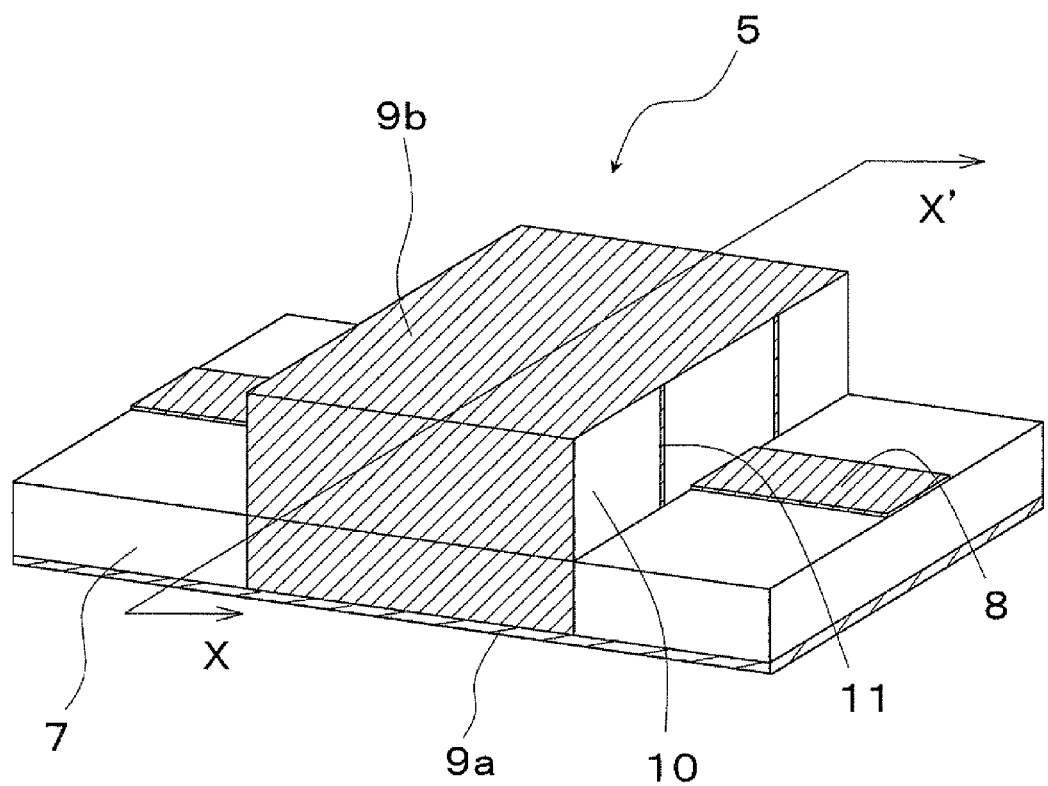
FIG. 2 is a perspective view showing an overview of an input-output terminal employed in the device housing package in accordance with the embodiment.

FIG. 1 is a perspective view showing an overview of a device housing package 1 in accordance with an embodiment. FIG. 2 is a perspective view showing an overview of an input-output terminal employed in the device housing package 1 shown in FIG. 1. The device housing package 1 is designed for use in electronic equipment, in particular, high-frequency circuitry of electronic equipment used in a high-frequency range such as a microwave range or a millimeter-wave range.

The device housing package 1 is used for the mounting of a device 2 formed, for example, of an active device such as a semiconductor device, an optical semiconductor device, a transistor, a diode, or a thyristor, or a passive device such as a resistor or capacitor. Note that the device housing package 1 on which the device 2 is mounted will be referred to as a mounting structure 1X.

The device housing package 1 includes: a substrate 3 having a device mounting region R for the device 2 in an upper face thereof; a frame body 4 having a through hole H formed in part thereof, the frame body being disposed on the substrate 3 so as to lie along a periphery of the device mounting region R; and an input-output terminal 5 disposed in the through hole H and configured to provide electrical connection between an interior of the frame body 4 and an exterior thereof.

The substrate 3 is a member having the shape of a rectangle as viewed in a plan view. For example, the substrate 3 is made of a metal material such as copper, iron, tungsten, molybdenum, nickel, or cobalt, or an alloy containing such metal materials. The substrate 3 has the capability to provide good thermal conductivity and thus allow for efficient dissipation of heat generated by the device 2 mounted on the device mounting region R to the outside therethrough. Note that the thermal conductivity of the substrate 3 is set to fall in the range of 15 W/(m·K) or more and 450 W/(m·K) or less, for example.

Moreover, the substrate 3 can be formed in a predetermined shape by performing heretofore known metalworking operation, such as rolling or punching, on an ingot made by solidification of a molten metal material cast in a mold form. Note that the length of a side of the rectangle defining the substrate 3 is set to fall in the range of 3 mm or more and 50 mm or less, for example. Moreover, the thickness of the substrate 3 is set to fall in the range of 0.3 mm or more and 5 mm or less, for example.

In the interest of prevention of oxidative corrosion or facilitation of brazing of the device 2 to the device mounting region R, the surface of the substrate 3 is coated with a nickel- or gold-made plating layer by an electroplating technique or electroless plating technique. The device mounting region R of the substrate 3 is a space which does not make connection with the frame body 4 when the frame body 4 is connected to the upper face of the substrate 3. Although the substrate 3 is rectangular in shape in this embodiment, the shape of the substrate 3 is not so limited. The substrate 3 may be given any other shape such as a polygonal shape or elliptical shape in so far as it is configured for the mounting of the device.

The frame body 4 is a member connected along a periphery of the device mounting region R on the substrate 3, for providing external protection for the device mounted on the device mounting region R. Moreover, the frame body 4 has a through hole H formed in part of its side face for the placement of the input-output terminal 5. The frame body 4 is brazed to the substrate 3 via a brazing material. The brazing material is made, for example, of silver, copper, gold, aluminum, or magnesium. Also, an additive substance such as nickel, cadmium, or phosphorus can be contained in the brazing material.

Moreover, the frame body 4 is made, for example, of a metal material such as copper, iron, tungsten, molybdenum, nickel, or cobalt, or an alloy containing such metal materials. The frame body 4 has the capability of dissipating heat generated by the device 2 from its interior to the outside efficiently under a condition where the device 2 is mounted on the device mounting region R. Note that the thermal conductivity of the frame body 4 is set to fall in the range of 15 W/(m·K) or more and 450 W/(m·K) or less, for example.

On the frame body 4 is disposed a lid body 6 under the condition where the device 2 is mounted on the device mounting region R. The lid body 6 has the capability of sealing the space surrounded by the substrate 2 and the frame body 4. The lid body 6 is brazed onto the frame body 4 via a brazing material, for example. The lid body 6 is made for example of a metal material such as copper, iron, tungsten, molybdenum, nickel, or cobalt, or an alloy containing such metal materials.

Figure 3:
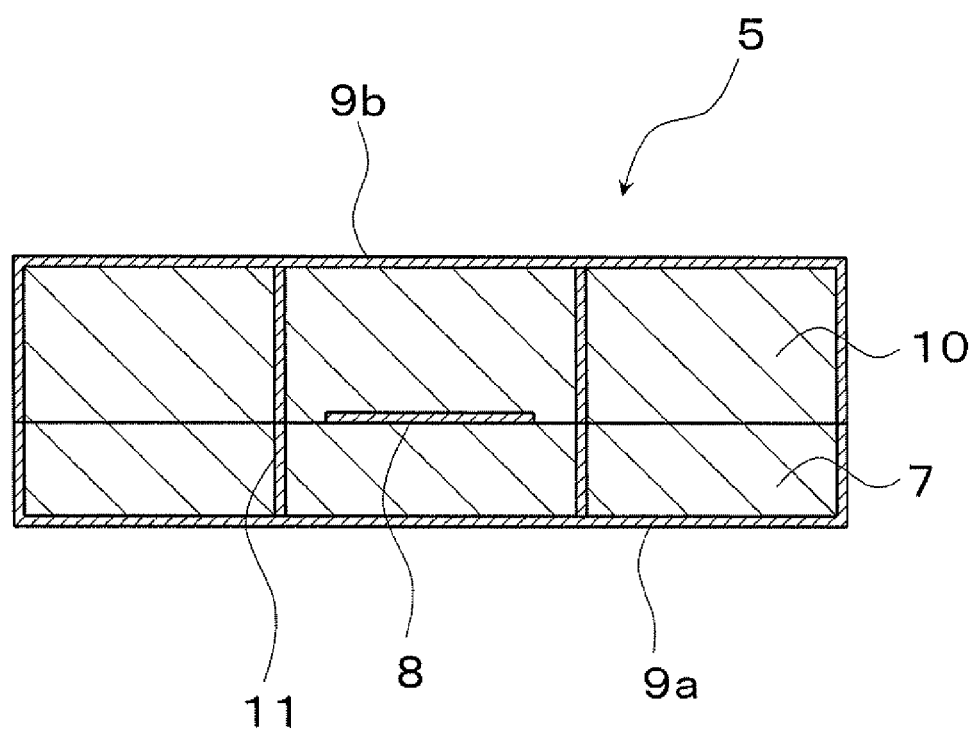
FIG. 3 is a sectional view of the input-output terminal taken along the line X-X' shown in FIG. 2.
Figure 4:
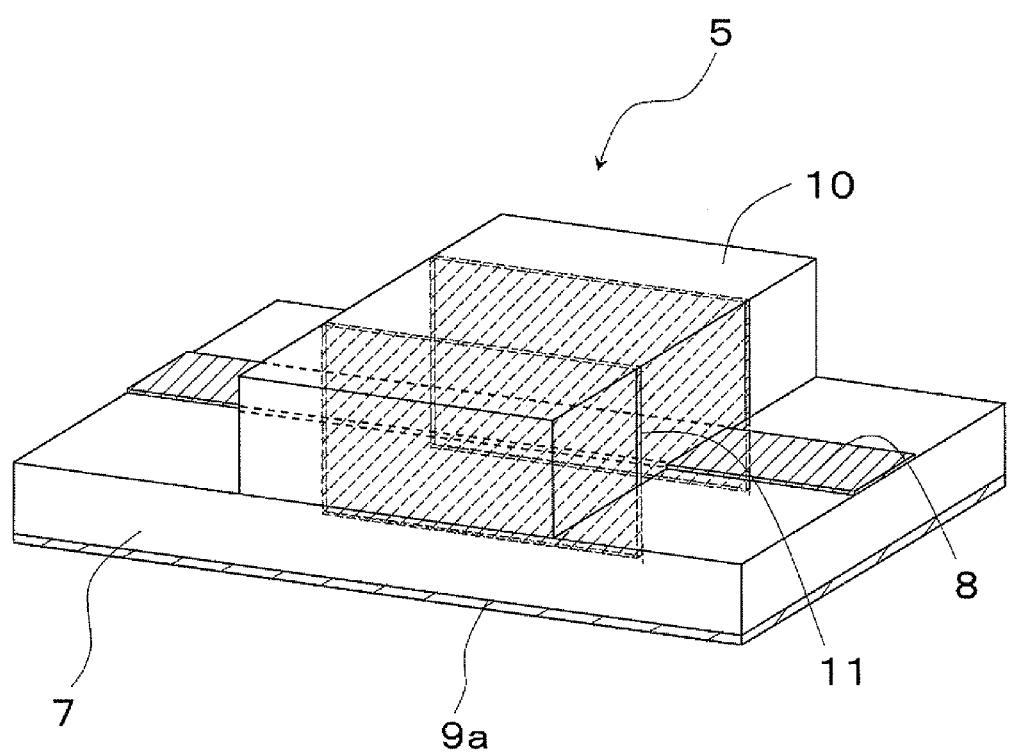
FIG. 4 is a transparent perspective view showing a positioning relationship between a signal line and a metal layer.

The following is a description of the input-output terminal 5. FIG. 3 is a sectional view of the input-output terminal 5 taken along the line X-X' shown in FIG. 2. Moreover, FIG. 4 is a transparent perspective view showing a positioning relationship between a signal line and a metal layer as shown in FIG. 2.

The input-output terminal 5 disposed in the through hole H includes: a first dielectric layer 7 extending interiorly and exteriorly of the frame body 4; a signal line 8 formed on the first dielectric layer 7 and configured to provide electrical connection between the interior of the frame body 4 and the exterior thereof; a first ground layer 9a formed on a lower face of the first dielectric layer 7; a second dielectric layer 10 formed on the signal line 8 so as to overlap the frame body as viewed in a transparent plan view; a second ground layer 9b formed on an upper face of the second dielectric layer 10; and a metal layer 11 disposed within the second dielectric layer 10 so as to extend from the interior of the frame body 4 to the exterior thereof along the signal line 8. Occasionally the first ground layer 9a and the second ground layer 9b together will be referred to as "the ground layer 9". In this construction, the signal line 8 and the ground layer 9 are taken as a pair to serve as a high-frequency transmission line.

The signal line 8 has the capability of transmission of predetermined electric signals. For example, the signal line 8 is used as a microstrip line or a coplanar line. The signal line 8 is made for example of a metal material such as tungsten, molybdenum, manganese, copper, silver, gold, aluminum, nickel, or chromium, or a mixture of such metal materials, or an alloy of such metal materials. The line width of the signal line 8 is set to be less than or equal to a quarter of the wavelength of a signal which is transmitted through the signal line 8, and more specifically set to fall in the range of 0.05 mm or more and 0.5 mm or less, for example.

The signal line 8 is formed with a lead terminal 12. The lead terminal 12 is a member for providing electrical connection between the device 2 and external electronic equipment and so forth. The lead terminal 12 is connected onto the signal line 8 via a brazing material, thus establishing electrical connection between the signal line 8 and the lead terminal 12.

Moreover, the first ground layer 9a is formed on the lower face of the first dielectric layer 7. The first ground layer 9a extends from the lower face of the first dielectric layer 7 to the side face of the first dielectric layer 7 and from there to the side face of the second dielectric layer 10, and the first ground layer 9a extending over the side face of the second dielectric layer 10 is connected to the second ground layer 9b formed on the upper face of the second dielectric layer 10. In this way, as shown in FIG. 2 or FIG. 3, the ground layer 9 is formed over the outer surfaces of the first dielectric layer 7 and the second dielectric layer 10. The ground layer 9 has the capability of ensuring potential equalization, for example, keeping an earth potential level. Moreover, the ground layer 9 is made for example of a metal material such as copper, silver, tungsten, molybdenum, manganese, gold, aluminum, nickel, or chromium, or diamond, or a mixture of such materials, or an alloy of such materials. The ground layer 9 is so formed as to overlap the signal line 8 as viewed in a plan view. The frame body 4 is made of a metal material, and the ground layer 9 and the frame body 4 are electrically connected to each other.

The first dielectric layer 7, as well as the second dielectric layer 10, has the form of an insulating substrate made, for example, of an inorganic material such as aluminum oxide, aluminum nitride, or silicon nitride, or an organic material such as epoxy resin, polyimide resin, or ethylene resin, or a ceramic material such as alumina or mullite, or a glass ceramic material, or a composite material prepared by mixing two or more of such materials. Note that the first dielectric layer 7 and the second dielectric layer 10 have a thickness which is less than or equal to a half of the wavelength of a signal to be transmitted through the signal line 8. For example, the thickness is set to fall in the range of 0.1 mm or more and 1.0 mm or less.

Moreover, the first dielectric layer 7 or the second dielectric layer 10 may be made to contain a large number of fillers. In the case where the first dielectric layer 7 or the second dielectric layer 10 is made of an organic material, when fillers are contained in the first dielectric layer 7 or the second dielectric layer 10, it is possible to make adjustment to the viscosity of the first dielectric layer 7 or the second dielectric layer 10 in a yet-to-be-cured state, and thereby approximate the thickness dimension of the first dielectric layer 7 or the second dielectric layer 10 to a desired value. The filler is shaped in a sphere, and its diameter is set to fall in the range of 0.05 µm or more and 6 µm or less, for example. The thermal expansion coefficient of the filler is set to fall in the range of −5 ppm/° C. or more and 5 ppm/° C. or below, for example. The filler is made for example of silicon oxide, silicon carbide, aluminum oxide, aluminum nitride, or aluminum hydroxide.

Moreover, the filler contained in the first dielectric layer 7 or the second dielectric layer 10 can be made smaller in relative permittivity than the material constituting the first dielectric layer 7 or the second dielectric layer 10. By using such a low-permittivity filler which is smaller in relative permittivity than the first dielectric layer 7 or the second dielectric layer 10, it is possible to render the dielectric layer as a whole lower in permittivity even further, and thereby increase the efficiency of transmission of a signal through the signal line 8.

Moreover, it is possible to impart insulation property to the filler. The use of an insulating filler helps reduce influences on the characteristic impedance of a signal transmitted through the signal line 8.

Disposed within the second dielectric layer 10 is the metal layer 11 which extends from the interior of the frame body 4 to the exterior thereof along the signal line 8.

The metal layer 11 is formed to extend from the inner wall of the second dielectric layer 10 to the outer wall thereof. That is, the metal layer 11 extends from an interior space which is surrounded by the frame body 4 to an exterior space which is not surrounded by the frame body 4. The metal layer 11 is made, for example, of a metal material such as copper, silver, tungsten, molybdenum, or manganese, or diamond, or a mixture of such materials, or an alloy of such material. Moreover, the thermal conductivity of the metal layer 11 is set to fall in the range of 20 W/m·k or more and 500 W/m·k or less, for example. The thickness of the metal layer 11 is set to fall in the range of 0.01 mm or more and 0.5 mm or less, for example.

Due to the heat generated by the device 2, the interior of the frame body 4 is likely to be brought into a high-temperature state compared to the exterior thereof. Especially in the case of passing a signal lying in a high-frequency range such as a microwave range or a millimeter-wave range through the signal line, the signal line could be subjected to high temperature due to high frequency level. In this case, the temperature of the device 2 placed inside the frame body 4 is caused to rise, which gives rise to the possibility of a change in the electric characteristics of the device 2. In this regard, with the provision of the metal layer 11, heat is transferred from the interior of the frame body 4 to the metal layer 11, and the heat is dissipated out of the frame body 4. This makes it possible to suppress confinement of the heat generated by the device 2 inside the frame body 4.

Moreover, when the input-output terminal 5 is viewed in a transparent plan view, the metal layer 11 is formed on each side of the signal line 8. The signal line 8 produces heat at the time of occurrence of high-frequency such as a microwave or a millimeter wave. The heat generated in the signal line 8 is radiated about the signal line 8 as viewed in a sectional view, and could eventually be confined inside the frame body 4. With this in view, by disposing the metal layer 11 on each side of the signal line 8, the heat generated in the, signal line 8 can be transferred efficiently to the metal layers 11.

Moreover, as shown in FIG. 3 or FIG. 4, the metal layer 11 extends from the first dielectric layer 7 to the second dielectric layer 10 for connection with both of them. Also, the metal layer 11 is spaced away from the signal line 8. The metal layer 11 is preferably formed in the shape of a plate extending along the signal line 8. By so doing, heat can be transferred from the signal line 8 to the metal layer effectively.

Moreover, the metal layer 11 extends from the lower end of the second dielectric layer 10 to the interior of first dielectric layer 7 and from there to the second ground layer 9b. Further, the metal layer 11 extends over the upper end of the second dielectric layer 10 for connection with the second ground layer 9b situated on the upper face of the second dielectric layer 10. Through the connection with the ground layer 9, the metal layer 11 stands at earth potential, for example. Accordingly, the metal layer 11 becomes able to shield an electric field induced by a high-frequency signal in the signal line 8. In this way, by virtue of the electric-field shielding effect provided by the metal layer 11, it is possible to suppress a change of the high-frequency transmission characteristics of the device 2 ascribable to an electric field generated in the signal line 8.

Moreover, the mounting structure 1X can be constructed by mounting the device 2 in the device housing package 1 via a bump such as a solder bump by the flip-chip mounting technique. In the case of mounting a semiconductor device such as IC or LSI, silicone, germanium, gallium arsenide, gallium arsenide phosphide, gallium nitride, silicon carbide, or the like can be used for the semiconductor device.

According to the embodiment, the metal layer 11, being disposed so as to extend, along the signal line 8, from the interior of the frame body 4 to the exterior thereof, acts to transfer the heat inside the frame body 4 to the outside thereof. This helps prevent the temperature of the interior of the frame body 4 from becoming higher than the temperature of the exterior of the frame body 4. Hence, there are provided a device housing package which excels in heat dissipation capability and a mounting structure employing the device housing package.

In what follows, let it be assumed that, when the input-output terminal 5 is viewed in a plan view, the metal layer 11 is not formed continuously from one end of the second dielectric layer 10 to the other end thereof, but is provided in the form of a plurality of separate metal columns serving as a ground layer. In such a case, out of signals transmitted to the signal line 8, some travel through the signal line after being reflected from the metal columns, and others travel through the signal line after passing through a region between the adjacent metal columns and then reflected from the ground layer 9 formed on the side face of the first dielectric layer 7 or the second dielectric layer 10. Therefore, in the case of designing the metal layer 11 in the form of a plurality of metal columns, when signals lying in a high-frequency range such as a microwave range and a millimeter-wave range are transmitted through the signal line 8, signal mode conversion takes place frequently. This leads to major electromagnetic-wave leaks.

Furthermore, in the case of using a plurality of metal columns instead of the metal layer 11, the metal columns are formed by creating a plurality of via holes in each of the first dielectric layer 7 and the second dielectric layer 10, and whereafter charging a metal paste in the via holes. Then, the second dielectric layer 10 is placed on the first dielectric layer 7, and the stacked layers are fired together in a body. However, if it is desired to form metal columns adaptable to high-frequency such as a millimeter wave, there will be a need to create minute via holes. In such a case, the via hole needs to have a diameter as small as falling in the range of 0.01 mm or more and 0.5 mm or less, for example. After all, it will be extremely difficult to create such a via hole by mechanical operation using a punch, wherefore it is expected that the via hole should be formed by means of laser light. However, even with use of laser light, the diameter of the via hole is so small that it will be difficult to arrange a plurality of via holes in a line as viewed in a plan view while exercising control of the positioning of the via holes properly.

Furthermore, as to the positioning of the via holes formed in the first dielectric layer 7 and the second dielectric layer 10, even slight deviation from the desired positions gives rise to the possibility of failure of connection between the metal column within the first dielectric layer 7 and the metal column within the second dielectric layer 10. This results in the disadvantage of causing the construction to be susceptible to electromagnetic-wave leakage. Furthermore, filling of a conductor paste or the like into a minute via hole is so difficult that the resulting metal column will be prone to poor conduction. In addition, in the embodiment, the input-output terminal 5 is made very compact. For example, the first dielectric layer 7 and the second dielectric layer 10 have a thickness falling in the range of 0.1 mm or more and 1.0 mm or less. Therefore, when a via hole is created by means of laser light for example, the input-output terminal 5 could become deformed due to heat evolved by the creation of the via hole. Eventually, the use of a plurality of metal columns in place of the metal layer 11 leads to complication in manufacturing process steps and thus to reduction in production yield.

On the other hand, according to the embodiment, since the metal layer 11 is continuously formed so as to extend, along the signal line 8, from the interior of the frame body 4 to the exterior thereof, it follows that signals can be maintained in a coaxial mode for long periods of time. This makes it possible to provide a device housing package which is less prone to electromagnetic-wave leakage and thus exhibits excellent electrical characteristics, and a mounting structure using the device housing package. Moreover, since the first dielectric layer 7 and the second dielectric layer 10 can be formed together with the metal layer 11 in a single body through firing, it is possible to achieve simplification in manufacturing process, and enhancement in production yield as well.

<Method for Manufacturing Device Housing Package>

Hereinafter, a method for manufacturing the device housing package 1 and the mounting structure 1X shown in FIG. 1 will be described.

To begin with, the substrate 3 and the frame body 4 are prepared. The substrate 3 and the frame body 4 are each formed in a predetermined shape by performing metalworking operation on an ingot made by solidification of a molten metal material cast in a mold form.

Next, the input-output terminal 5 is prepared. The following description deals with a method of manufacturing the input-output terminal 5 for the case where sintered aluminum oxide, sintered aluminum nitride, sintered mullite, or the like is used as the material of construction of the first dielectric layer 7 and the second dielectric layer 10.

Specifically, where the first dielectric layer 7 and the second dielectric layer 10 are made of sintered aluminum oxide, at first, an organic binder and a plasticizer or a solvent are admixed in raw material powder such as aluminum oxide, silicon oxide, magnesium oxide, calcium oxide, and the like to form a slurry.

Figure 5:
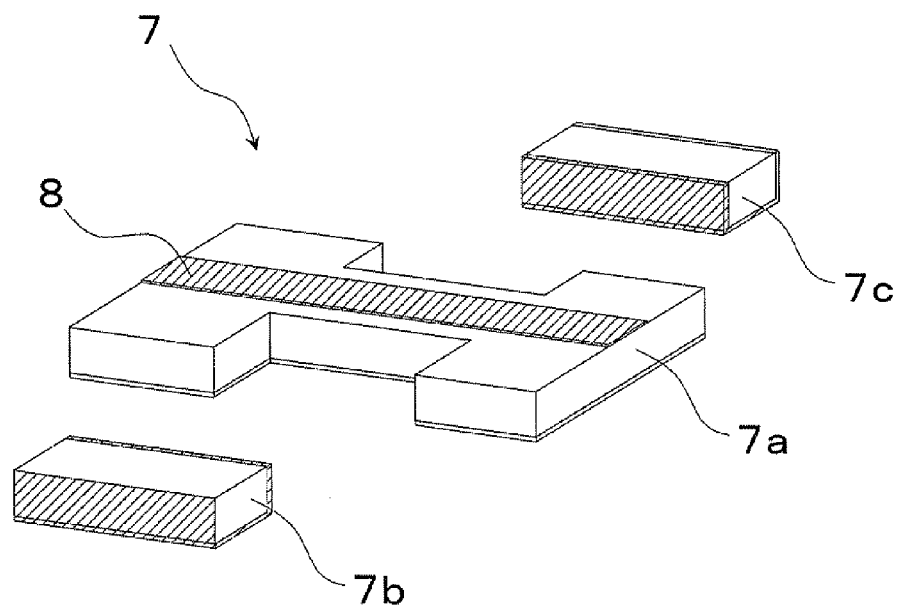
FIG. 5(A) is an exploded perspective view of a first dielectric layer.
FIG. 5(B) is an exploded perspective view of a second dielectric layer.
Figure 5:
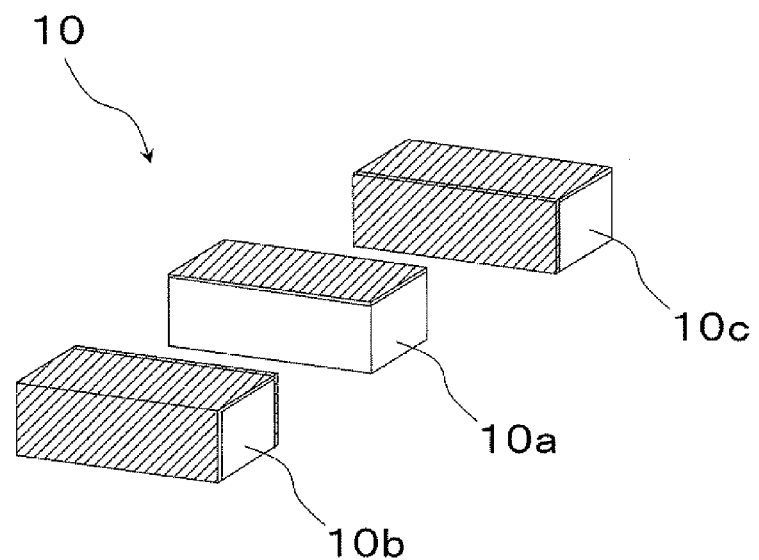

Then, mold forms for the first dielectric layer 7 and the second dielectric layer 10 are prepared. As shown in FIG. 5(A), the first dielectric layer 7 is divided into three portions, namely a first base 7a having the signal line 8 formed on an upper face thereof and the ground layer 9 formed on a lower face thereof, and second and third bases 7b and 7c, with the signal line 8 formed between their metal layers 11 in a sandwiched manner.

In terms of the mold form of the first dielectric layer 7, mold forms are prepared separately for the individual bases, namely the first base 7a, the second base 7b, and the third base 7c. The aluminum oxide material in slurry form is charged into each of the mold forms, and whereafter the first base 7a, the second base 7b, and the third base 7c in a yet-to-be-sintered state are taken out.

As shown in FIG. 5(B), the second dielectric layer 10 is divided into three portions, namely a fourth base 10a which is disposed on the first base 7a, a fifth base 10b which is disposed on the second base 7b, and a sixth base 10c which is disposed on the third base 7c. In terms of the mold form of the second dielectric layer 10, mold forms are prepared separately for the individual bases, namely the fourth base 10a, the fifth base 10b, and the sixth base 10c. The aluminum oxide material in slurry form is charged into each of the mold forms, and whereafter the fourth base 10a, the fifth base 10b, and the sixth base 10c in a yet-to-be-sintered state are taken out.

Moreover, high-melting-point metal powder such for example as tungsten or molybdenum is prepared, and an organic binder and a plasticizer or a solvent are admixed in the powder to obtain a metal paste.

Then, the metal paste is applied to predetermined locations of each of the first base 7a, the second base 7b, the third base 7c, the fourth base 10a, the fifth base 10b, and the sixth base 10c in precursor form by a screen printing technique for example, in such a manner that the signal line 8 and the ground layer 9 can be formed when the bases are combined together to constitute the first dielectric layer 7 and the second dielectric layer 10.

Next, the second dielectric layer 10 in precursor form is placed on the first dielectric layer 7 in precursor form, and they are brought into intimate contact with each other under pressure. Then, the stacked body is fired at a temperature of about 1600° C., whereupon the ceramic-made input-output terminal 5 is fabricated.

Subsequently, the input-output terminal 5 is brazed into the through hole H of the frame body 4 prepared with use of a brazing material. In this way, the device housing package 1 can be constructed.

Next, the device 2 is mounted in the device housing package 1 via solder, and the lid body 6 is disposed on the frame body 4. In this way, the mounting structure 1X can be constructed.

MODIFIED EXAMPLES

It should be understood that the application of the invention is not limited to the specific embodiment described heretofore, and that various changes and modifications are possible without departing from the spirit and scope of the invention. Hereinafter, examples of modified form of the above-mentioned embodiment will be described. In the following device housing packages implemented by way of modified examples of the above-mentioned embodiment, such constituent components as are common to those of the device housing package of the above-mentioned embodiment will be identified with the same reference symbols, and overlapping descriptions may be omitted.

Modified Example 1

Figure 6:
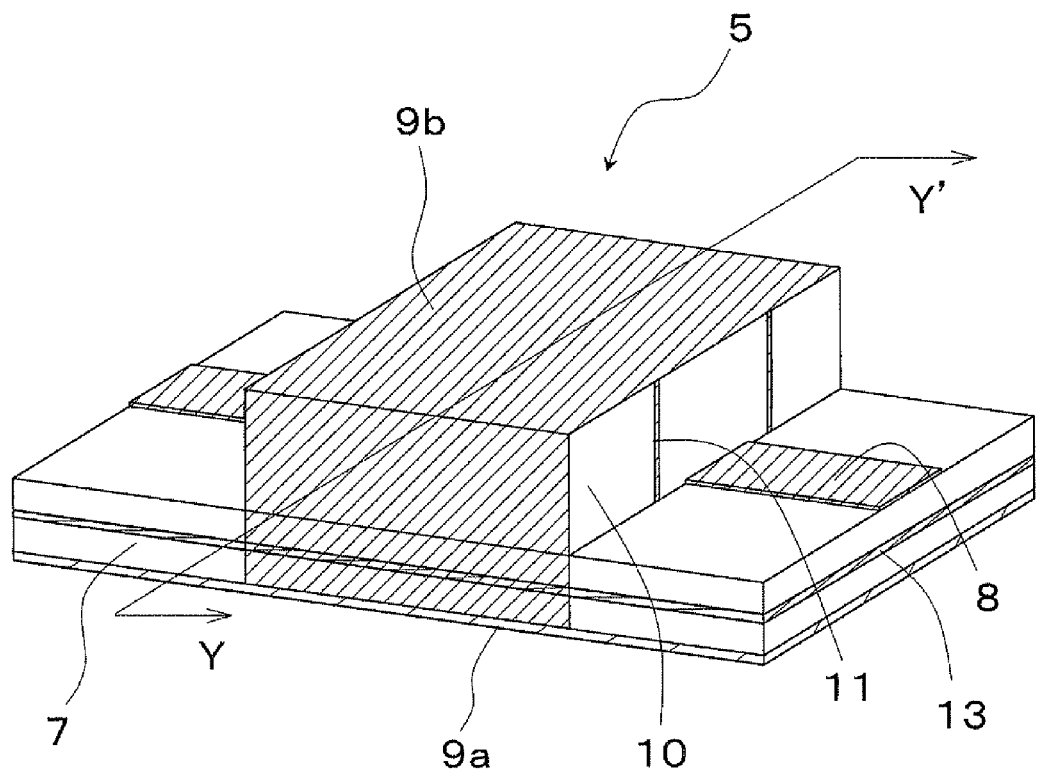
FIG. 6 is a perspective view showing an overview of the input-output terminal in accordance with one modified example.
Figure 7:
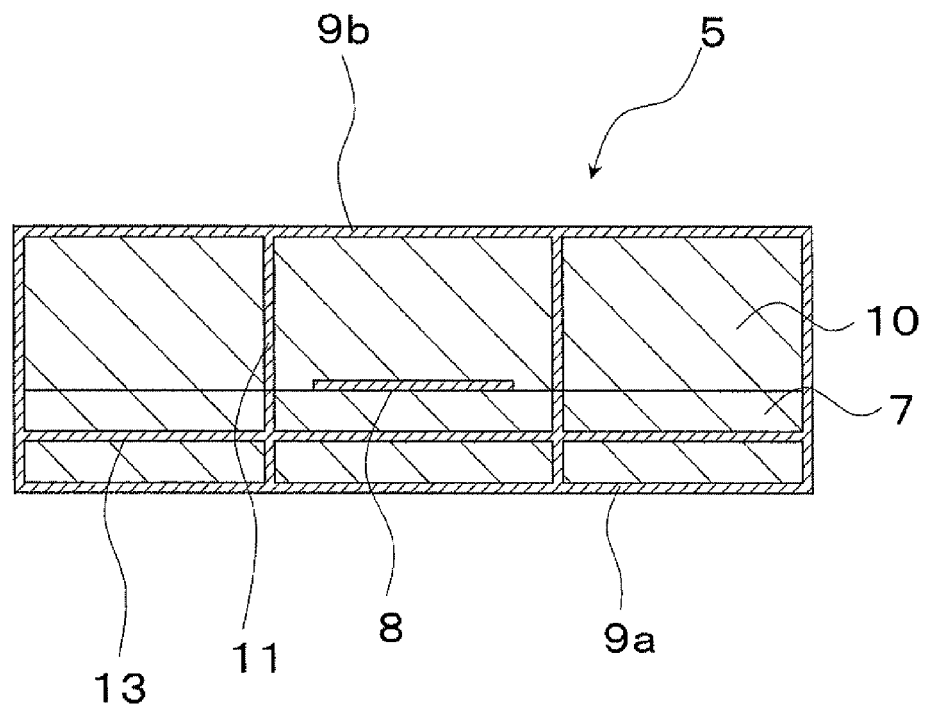
FIG. 7 is a sectional view of the input-output terminal taken along the line Y-Y' shown in FIG. 6.

FIG. 6 is a perspective view showing an overview of an input-output terminal of a modified example 1, and FIG. 7 is a sectional view of the input-output terminal taken along the line Y-Y' shown in FIG. 6.

While, in the above-mentioned embodiment, the metal layer 11 is disposed so as not to overlap the signal line 8, the invention is not so limited. For example, as shown in FIG. 6 or FIG. 7, aside from the metal layer 11, a heat-transfer layer 13 can additionally be disposed so as to overlap the signal line 8.

The heat-transfer layer 13 is disposed within the first dielectric layer 7. The heat-transfer layer 13 extends from the interior of the frame body 4 to the exterior thereof and thus has the capability of transferring the heat inside the frame body 4 to the outside thereof. The heat-transfer layer 13 is so formed as to lie along the top face of the signal line 8. The heat-transfer layer 13 is connected to the metal layer 11 within the first dielectric layer 7, and is further connected to the ground layer 9 formed on the side face of the first dielectric layer 7. In this modified example, the placement of the heat-transfer layer 13 in addition to the metal layer 11 makes it possible to achieve enhancement in heat-dissipation effect.

Modified Example 2

Figure 8:
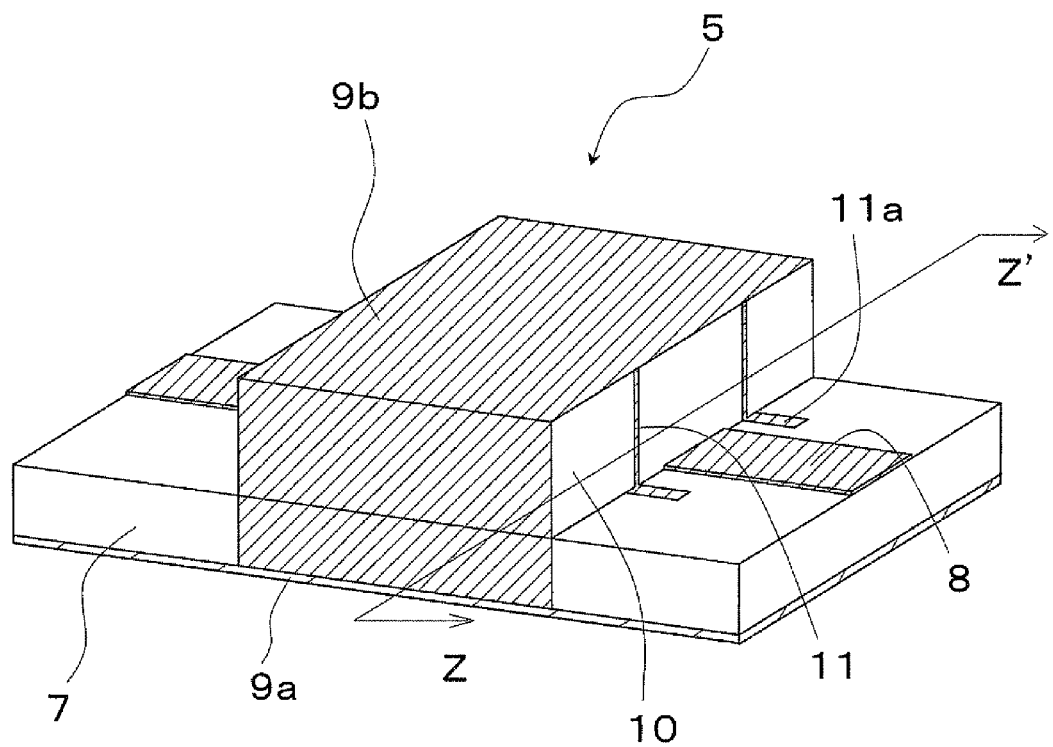
FIG. 8 is a perspective view showing an overview of an input-output terminal in accordance with one modified example.
Figure 9:
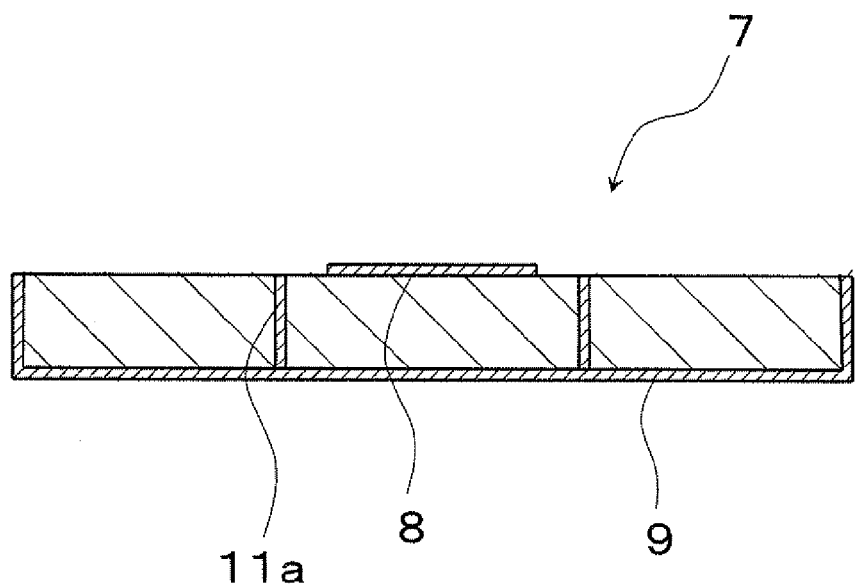
FIG. 9 is a sectional view of the input-output terminal taken along the line Z-Z' shown in FIG. 8.

FIG. 8 is a perspective view showing an overview of an input-output terminal of a modified example 2, and FIG. 9 is a sectional view of the input-output terminal taken along the line Z-Z' shown in FIG. 8.

As shown in FIG. 8 or FIG. 9, the metal layer 11 can extend from the wall of the second dielectric layer 10 to the upper face of the first dielectric layer 7. By extending part of the metal layer 11, namely a portion 11a, over the upper face of the first dielectric layer 7, it is possible to increase the area of that part of the metal layer 11 which is exposed outside of the frame body 4, and thereby enhance the heat-dissipation effect of the metal layer 11.

Moreover, the portion 11a of the metal layer 11 extends from that part of the interior of the first dielectric layer 7 which overlaps the second dielectric layer 10 to that part of the interior of the first dielectric layer 7 which does not overlap the second dielectric layer 10 as viewed in a plan view. Then, the signal line 8 is positioned between a pair of the metal layers 11. This makes it possible to achieve a gradual change in electric-field shielding variation around the signal line 8, and thereby suppress a change of the electrical characteristics of a signal transmitted through the interior of the signal line 8.

As to the signal transmitted through the signal line 8, the shorter the distance to a layer serving as the ground becomes, the shorter the time for reflection of the signal from the layer serving as the ground can make, thus affording adaptability to signals of even higher frequency level. On the other hand, in the embodiment shown in FIG. 2, the metal layer 11 serving as the ground surrounding the signal line 8 does not extend from that part of the interior of the first dielectric layer 7 which overlaps the second dielectric layer 10 to that part thereof which does not overlap the second dielectric layer 10 as viewed in a plan view. Therefore, at the boundary between that part of the first dielectric layer 7 which overlaps the second dielectric layer 10 and that part of the first dielectric layer 7 which does not overlap the second dielectric layer 10 as viewed in a plan view, an electric field is generated in a range from the signal line 8 to the ground layer 9 formed on the side face of the first dielectric layer 7 or the second dielectric layer 10.

With this in view, as shown in FIG. 8 or FIG. 9, by forming the metal layer 11 so as to extend through the boundary to the interior of the first dielectric layer 7, it is possible to shield the electric field generated at the boundary in the range from the signal line 8 to the ground layer 9 formed on the side face of the first dielectric layer 7 or the second dielectric layer 10, and thereby attain excellent high-frequency transmission characteristics for the signal transmitted through the interior of the signal line 8.

Modified Example 3

Figure 10:
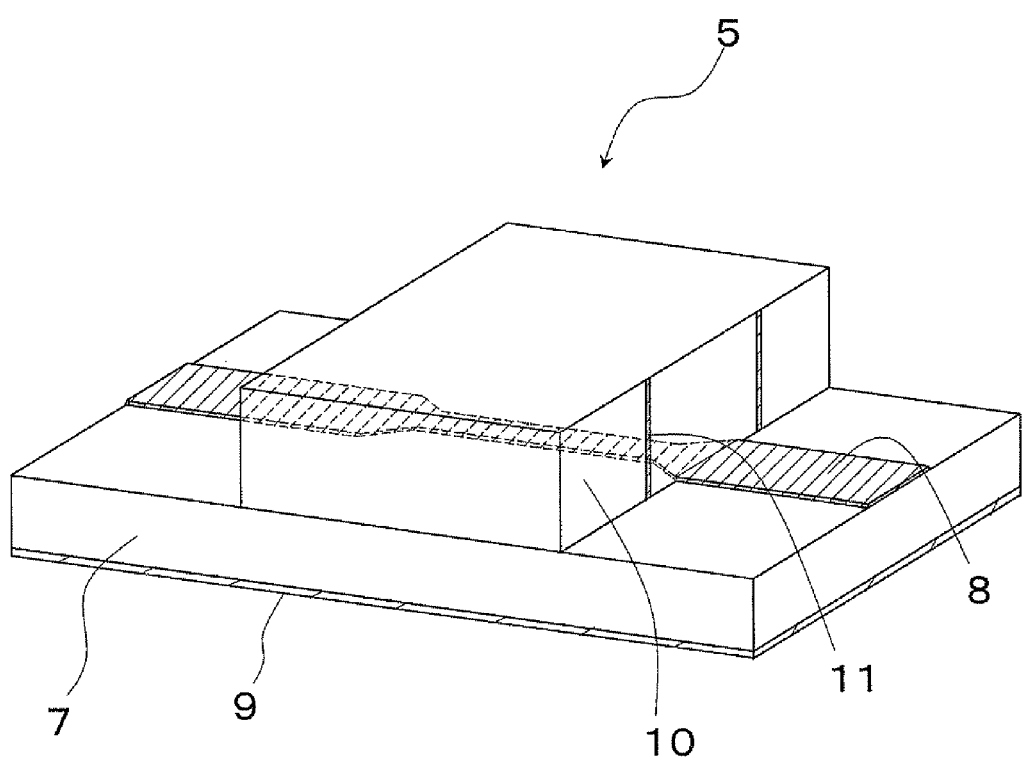
FIG. 10 is a perspective view showing an overview of an input-output terminal in accordance with one modified example.

FIG. 10 is a perspective view showing an overview of the input-output terminal of a modified example 3, with the signal line 8 lying between the first dielectric layer 7 and the second dielectric layer 10 represented transparently.

As shown in FIG. 10, in the signal line 8 as viewed in a plan view, that part thereof located in the region of overlap between the second dielectric layer 10 and the first dielectric layer 7 can be changed in its thickness in a planar direction. That part of the signal line 8 disposed in overlapping relation with the second dielectric layer 10 as viewed in a plan view is set to be smaller in thickness in the planar direction than that part of the signal line 8 disposed in non-overlapping relation with the second dielectric layer 10. This makes it possible to attain desired electrical characteristics for the signal transmitted through the interior of the signal line 8.

Modified Example 4

Figure 11:
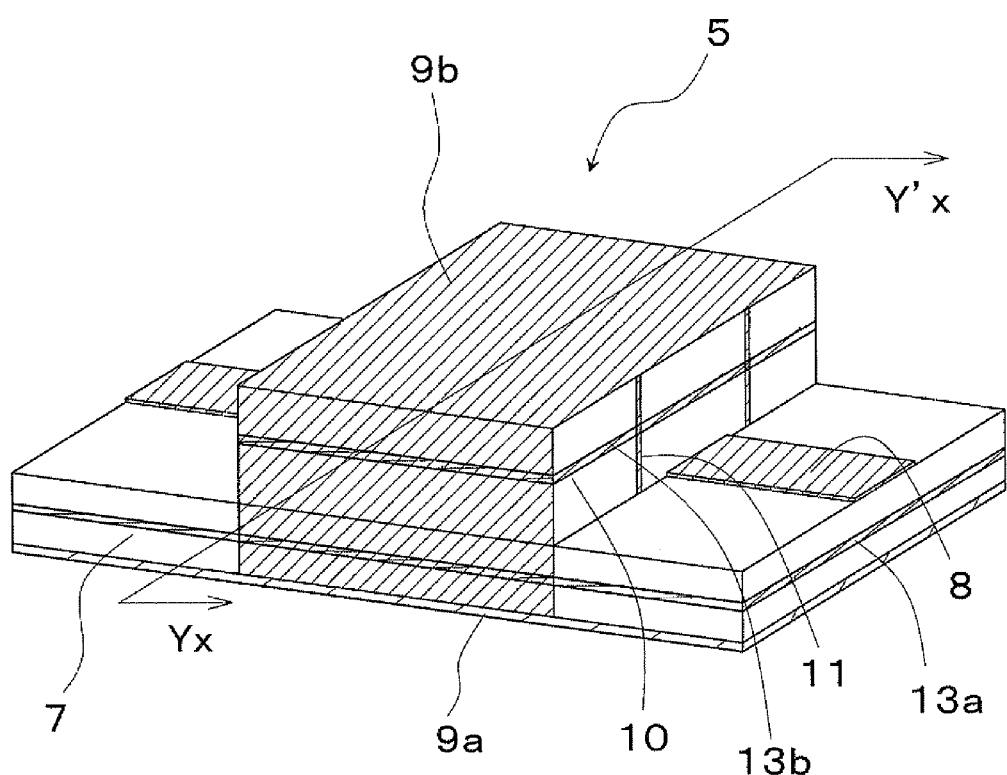
FIG. 11 is a perspective view showing an overview of an input-output terminal in accordance with one modified example.
Figure 12:
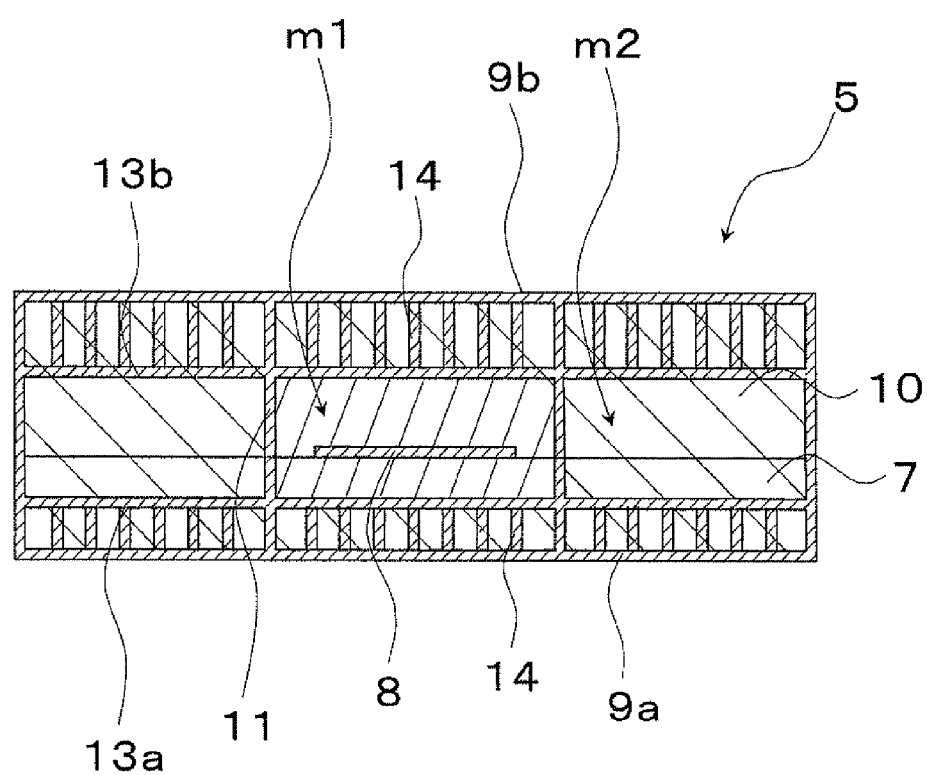
FIG. 12 is a sectional view of the input-output terminal taken along the line Yx-Y'x shown in FIG. 11.

FIG. 11 is a perspective view showing an overview of an input-output terminal of a modified example 4, and FIG. 12 is a sectional view of the input-output terminal taken along the line Yx-Y'x shown in FIG. 11.

While, in the above-mentioned embodiment, fillers are contained in the first dielectric layer 7 or the second dielectric layer 10 for reduction in relative permittivity, the invention is not so limited. For example, as shown in FIG. 12, a member m1 situated around the signal line 8 as viewed in a sectional view is set to be smaller in permittivity than a member m2 situated in the periphery of the member m1.

As shown in FIG. 12, the member m1 exists in a region surrounded by a pair of the metal layers 11 as viewed in a sectional view. Moreover, the member m1 is located between a first heat-transfer layer 13a and a second heat-transfer layer 13b arranged one above the other, which will hereafter be described.

In the case of forming the member m1 of a porous material which contains a larger number of closed pores than that of the member m2, the permittivity of the member m1 is lower than that of the member m2. The member m1 can be made lower in permittivity than the member m2 also by using a material whose permittivity is lower than that of the member m2. For example, a low-permittivity material such as a glass ceramic material can be used for the member m1. Note that the input-output terminal of this modified example is composed of a plurality of members. At this time, it is advisable that the members are bonded together in a body by means of brazing, soldering, or otherwise after performing metallization or plating process on the juncture between the members.

In the case where a signal which is to be transmitted through the signal line 8 falls in a high-frequency range such as a microwave range or a millimeter-wave range, there is a need to downsize the member m1 by reducing the distance between the signal line 8 and the metal layer 11. In this regard, even if a high-frequency signal is transmitted through the signal line 8, by designing the member m1 to have a lower permittivity, it is possible to secure a larger space between the metal layers 11. Accordingly, the member m1 can be made in a moderately large size, which results in the advantage to make easy handling and assembly of the components constituting the input-output terminal in the course of manufacture.

Moreover, as the heat-transfer layer, the first heat-transfer layer 13a is disposed within the first dielectric layer 7, whereas the second heat-transfer layer 13b is disposed within the second dielectric layer 10. The first heat-transfer layer 13a and the second heat-transfer layer 13b extend from the interior of the frame body 4 to the exterior thereof and thus have the capability of transferring the heat inside the frame body 4 to the outside thereof.

Moreover, it is advisable to dispose a plurality of via conductors 14 between the ground layer 9 situated on the lower face of the input-output terminal and the first heat-transfer layer 13a, or between the ground layer 9 situated on the upper face of the input-output terminal and the second heat-transfer layer 13b. In this case, the grounding properties of the ground layer 9 and the heat-transfer layer 13a, or the grounding properties of the ground layer 9 and the heat-transfer layer 13b, can be enhanced. The via conductor 14 can be formed by creating a via hole in a ceramic green sheet by means of laser light and whereafter printing a conductor in the via hole.

In the modified example, in so far as the input-output terminal 5 is so designed that the member m1 is smaller in permittivity than other member around the member m1, it is possible to remove part of the first dielectric layer 7 situated below the first heat-transfer layer 13a, as well as part of the second dielectric layer 10 situated above the second heat-transfer layer 13b.

Modified Example 5

Figure 13:
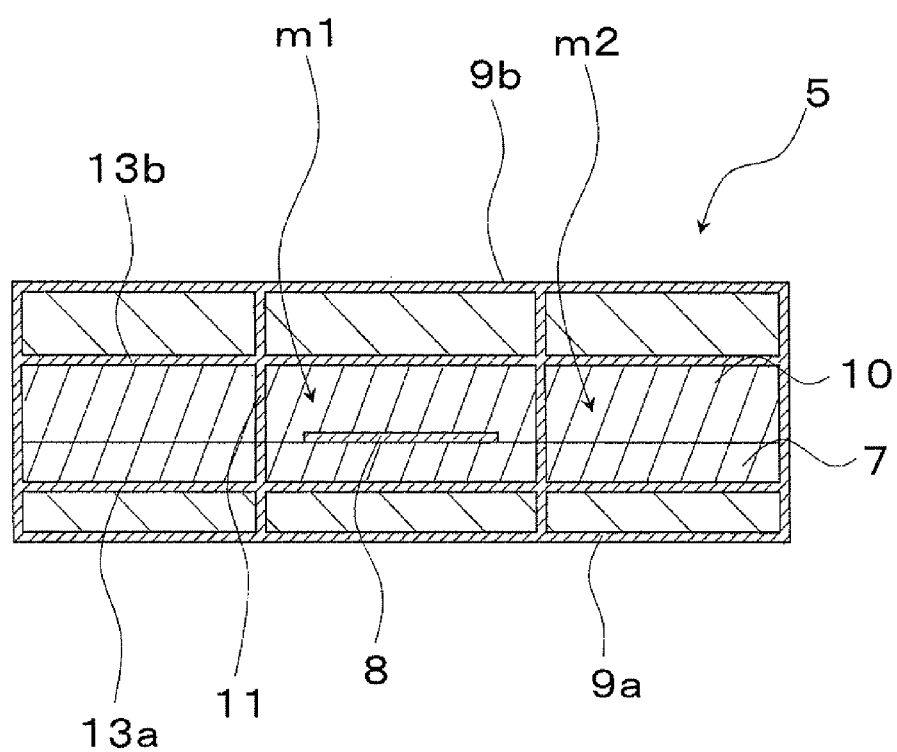
FIG. 13 is a sectional view of an input-output terminal in accordance with one modified example.

FIG. 13 is a sectional view of the input-output terminal of a modified example 5. While, in the modified example 4, the permittivity of the member m1 situated between the paired metal layers 11 is set to be smaller than the permittivity of other member around the member m1, the invention is not so limited. For example, as shown in FIG. 13, the first dielectric layer 7 and the second dielectric layer 10 are each composed of a plurality of layers. Moreover, the permittivity of a constituent layer closer to the signal line 8 is set to be smaller than the permittivity of other constituent layer located around that constituent layer.

In FIG. 13, the permittivity of the constituent layer of the first dielectric layer 7 situated above the first heat-transfer layer 13a is set to be smaller than the permittivity of the constituent layer of the first dielectric layer 7 situated below the first heat-transfer layer 13a. Moreover, the permittivity of the constituent layer of the second dielectric layer 10 situated below the second heat-transfer layer 13b is set to be smaller than the permittivity of the constituent layer of the second dielectric layer 10 situated above the second heat-transfer layer 13b.

In the first dielectric layer 7 or the second dielectric layer 10, as a method to permit connection of the bordering constituent layers having different permittivities, it is advisable to provide a connection layer at the boundary between the constituent layers in advance by means of metallization, plating, or otherwise. In this way, the constituent layers can be bonded together in a single body via the connection layer.

Figure 14:
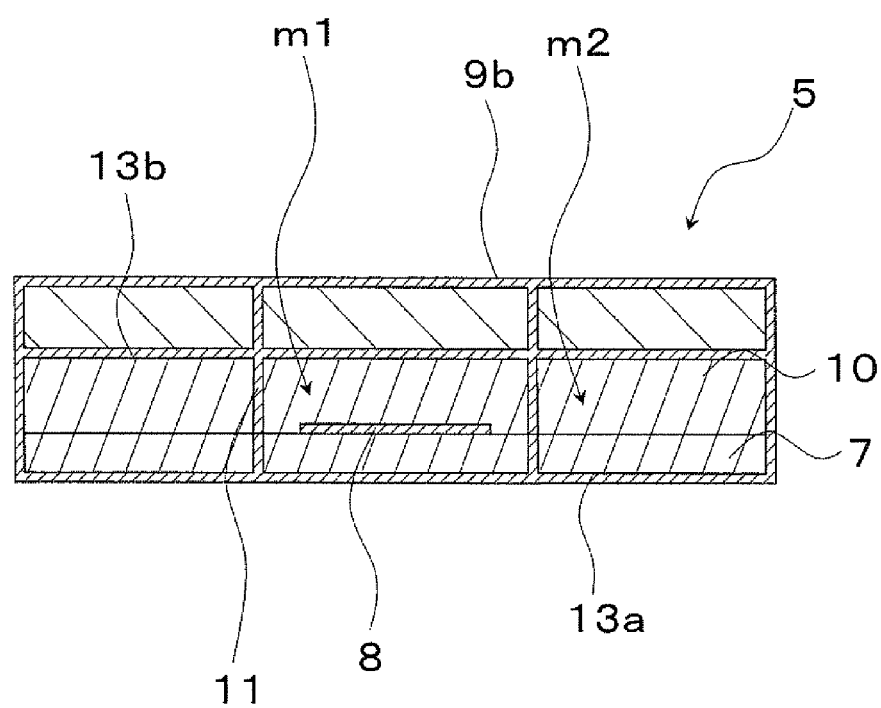
FIG. 14 is a sectional view of an input-output terminal in accordance with one modified example.
Figure 15:
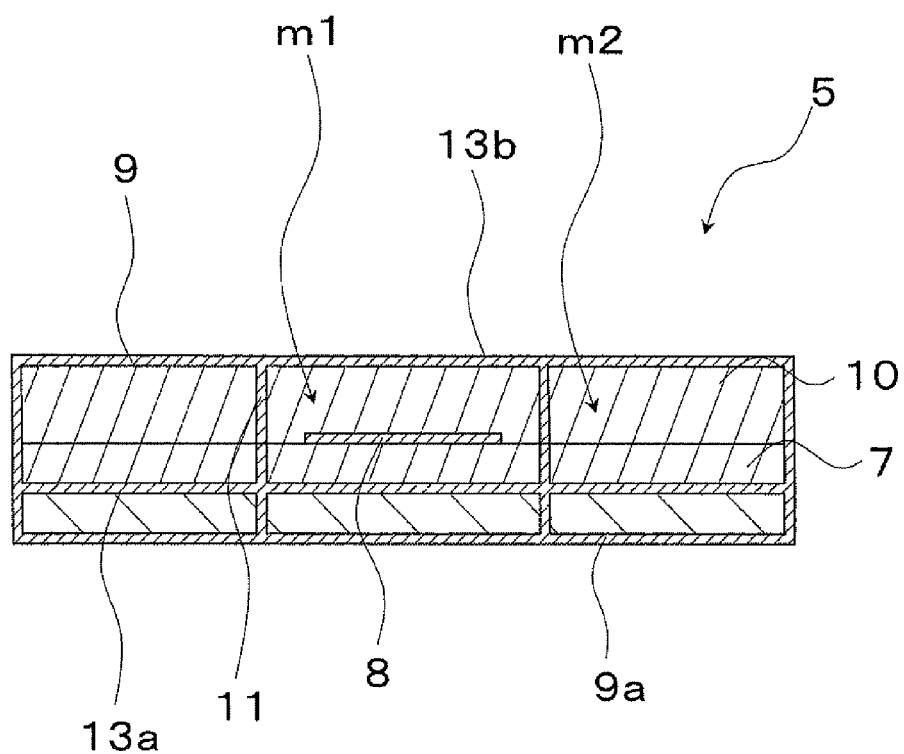
FIG. 15 is a sectional view of an input-output terminal in accordance with one modified example.

Alternatively, in this modified example, as shown in FIG. 14, the first dielectric layer 7 is formed of a single layer. In this case, the first dielectric layer 7 and the constituent layer of the second dielectric layer 10 situated below the second heat-transfer layer 13b are set to be smaller in permittivity than the constituent layer of the first dielectric layer 7 situated above the second heat-transfer layer 13b. In another alternative, as shown in FIG. 15, the second dielectric layer 10 is formed of a single layer. In this case, the second dielectric layer 10 and the constituent layer of the first dielectric layer 7 situated above the first heat-transfer layer 13a are set to be smaller in permittivity than the constituent layer of the first dielectric layer 7 situated below the first heat-transfer layer 13a.

Modified Example 6

Figure 16:
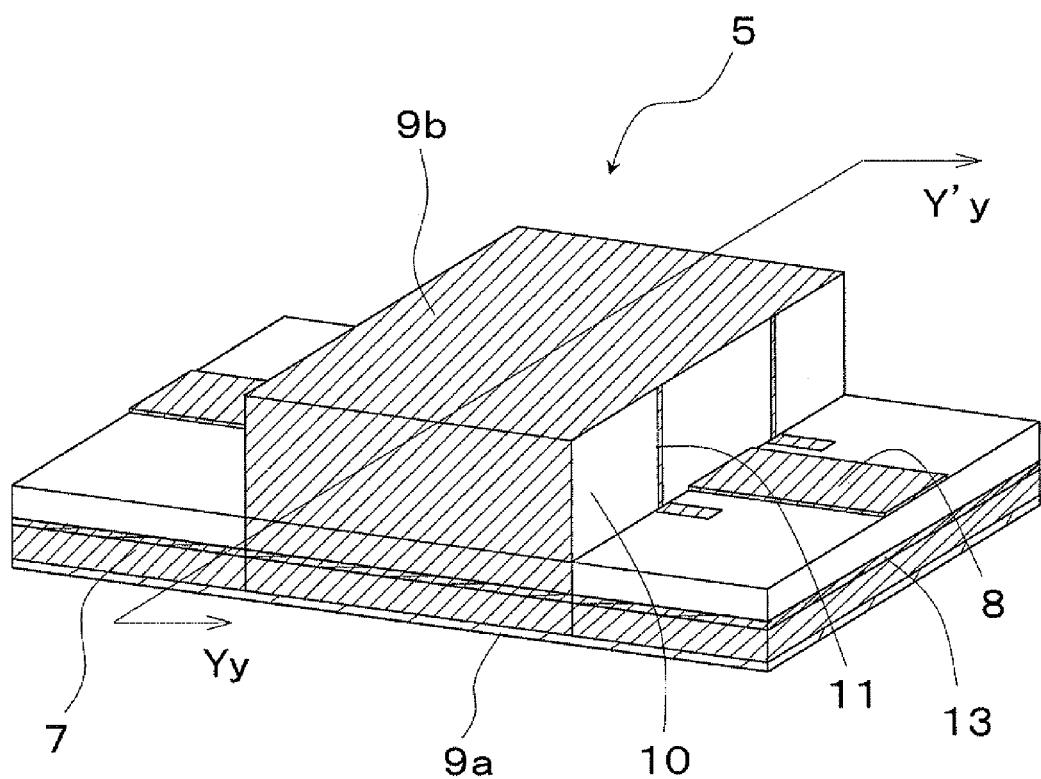
FIG. 16 is a perspective view showing an overview of an input-output terminal in accordance with one modified example.
Figure 17:
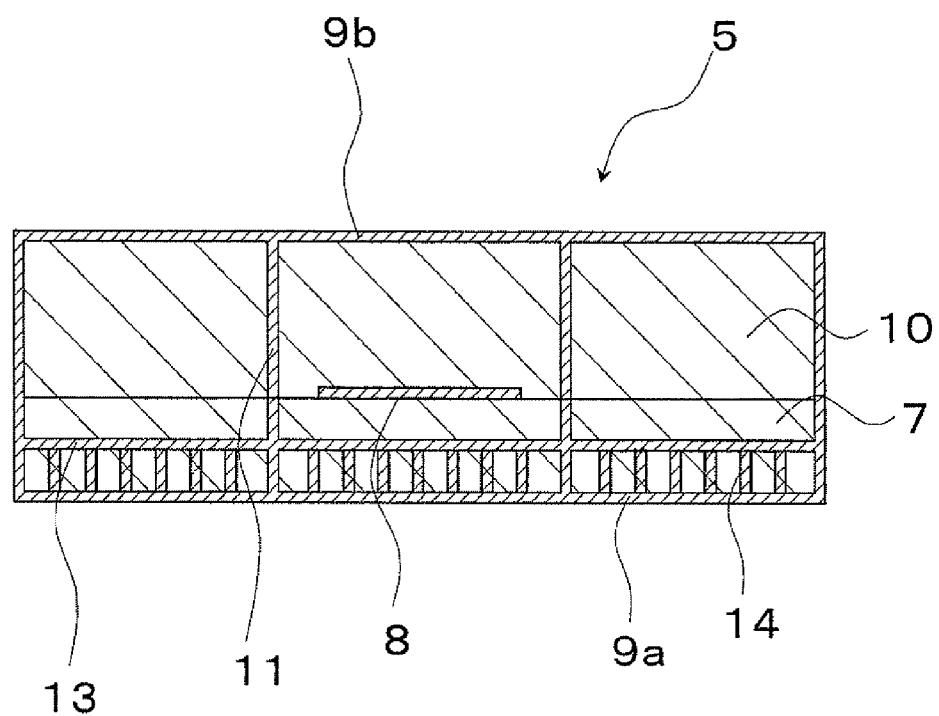
FIG. 17 is a sectional view of the input-output terminal taken along the line Yy-Y'y shown in FIG. 6.

FIG. 16 is a perspective view showing an overview of the input-output terminal of a modified example 6, and FIG. 17 is a sectional view of the input-output terminal taken along the line Yy-Y'y shown in FIG. 16.

The lower face of the first dielectric layer 7 is formed with the first ground layer 9a. Moreover, the upper face of the first dielectric layer 7 is formed with the first heat-transfer layer 13a. Thus, the first dielectric layer 7 is divided into an upper part and a lower part with respect to the first heat-transfer layer 13a. In addition, as shown in FIG. 17, via conductors 14 are formed so as to pass vertically through the lower part under the first heat-transfer layer 13a.

Now, a description will be given as to the case of using, instead of the first dielectric layer 7, a metal plate having a thickness equivalent to the thickness of the first dielectric layer 7. In order to suppress the influence of electromagnetic waves, the input-output terminal, through which high-frequency such as a microwave or a millimeter wave is transmitted, needs to be made very compact. If the metal plate is used in place of the first dielectric layer 7, due to the difference in thermal expansion coefficient between the metal plate and the second dielectric layer 10, it is highly likely that the second dielectric layer 10 will accidentally become detached from the metal plate. That is, the second dielectric layer 10 tends to be warped against the metal plate and consequently becomes detached therefrom.

In contrast, according to the modified example 6, disposed on the lower face of the second dielectric layer 10 is not the metal body but the first dielectric layer 7 made of a ceramic material which is closely similar in thermal expansion coefficient to the second dielectric layer 10. Therefore, even if the second dielectric layer 10 is thermally expanded against the first dielectric layer 7, by virtue of the close similarity in thermal expansion coefficient between the layers, accidental separation between the first dielectric layer 7 and the second dielectric layer 10 can be suppressed.

Moreover, in the modified example 6, the plurality of via conductors 14 are arranged on the entire surface and in the interior of the first dielectric layer 7. This makes it possible to maintain the grounding capability of the first dielectric layer 7, as well as to suppress accidental separation of the first dielectric layer 7 from the second dielectric layer 10.

The invention claimed is:

1. A device housing package, comprising:
   a substrate having a device mounting region in an upper face thereof;
   a frame body having a through hole formed in part thereof, the frame body being disposed on the substrate so as to lie along a periphery of the device mounting region; and
   an input-output terminal disposed in the through hole, the input-output terminal having
   a first dielectric layer extending interiorly and exteriorly of the frame body;
   a signal line formed on the first dielectric layer and configured to provide electrical connection between an interior of the frame body and an exterior thereof;
   a first ground layer formed on a lower face of the first dielectric layer;
   a second dielectric layer formed on the signal line so as to overlap the frame body as viewed in a transparent plan view;
   a second ground layer formed on an upper face of the second dielectric layer; and
   a pair of metal layers disposed within the second dielectric layer so as to extend from the interior of the frame body to the exterior thereof along the signal line,
   wherein the pair of metal layers are formed to extend from the second dielectric layer to the first dielectric layer, connecting with the first ground layer and the second ground layer, being separated from the signal line.

2. The device housing package according to claim 1, wherein the pair of metal layers are so formed as to extend from an inner wall of the second dielectric layer exposed inside the frame body to an outer wall of the second dielectric layer exposed outside the frame body.

3. The device housing package according to claim 1, wherein the signal line is formed between the pair of metal layers, as viewed in a transparent plan view.

4. The device housing package according to claim 3, wherein the first dielectric layer and the second dielectric layer are each composed of a plurality of members, within the first dielectric layer is disposed a first heat-transfer layer which is electrically connected to at least one of the first ground layer and the second ground layer, and within the second dielectric layer is disposed a second heat-transfer layer which is electrically connected to at least one of the first ground layer and the second ground layer, and
   a region surrounded by a pair of the first and second heat-transfer layers and the pair of metal layers as viewed in a sectional view is smaller in permittivity than the members constituting the first dielectric layer and the second dielectric layer that are located outside of the region surrounded by the pair of the first and second heat-transfer layers and the pair of the metal layers.

5. The device housing package according to claim 3, wherein the first dielectric layer and the second dielectric layer are each composed of a plurality of members, within the first dielectric layer is disposed a first heat-transfer layer which is electrically connected to at least one of the first ground layer and the second ground layer, and within the second dielectric layer is disposed a second heat-transfer layer which is electrically connected to at least one of the first ground layer and the second ground layer, and
   a plurality of via conductors are arranged between the first heat-transfer layer and the lower face of the first dielectric layer, or between the second heat-transfer layer and the upper face of the second dielectric layer.

6. The device housing package according to claim 1, wherein the first dielectric layer is composed of a plurality of layers,
   within the first dielectric layer is disposed a heat-transfer layer which is electrically connected to at least one of the first ground layer and the second ground layer, and
   a portion of the first dielectric layer which is located above the heat-transfer layer is smaller in permittivity than a portion of the first dielectric layer which is located below the heat-transfer layer.

7. The device housing package according to claim 1, wherein the second dielectric layer is composed of a plurality of layers,
   within the second dielectric layer is disposed a heat-transfer layer which is electrically connected to at least one of the first ground layer and the second ground layer, and
   a portion of the second dielectric layer which is located below the heat-transfer layer is smaller in permittivity than a portion of the second dielectric layer which is located above the heat-transfer layer.

8. A mounting structure, comprising:
   the device housing package according to claim 1; and
   a device mounted in the device housing package.

* * * * *